(12) United States Patent
Sahara et al.

(10) Patent No.: US 8,942,003 B2
(45) Date of Patent: *Jan. 27, 2015

(54) MULTILAYERED PRINTED WIRING BOARD

(71) Applicants: Takahiro Sahara, Tokyo (JP); Atsushi Kobayashi, Tokyo (JP); Kiyoshi Takeuchi, Tokyo (JP); Masahiko Igaue, Tokyo (JP)

(72) Inventors: Takahiro Sahara, Tokyo (JP); Atsushi Kobayashi, Tokyo (JP); Kiyoshi Takeuchi, Tokyo (JP); Masahiko Igaue, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/766,809

(22) Filed: Feb. 14, 2013

(65) Prior Publication Data

US 2013/0220686 A1 Aug. 29, 2013

Related U.S. Application Data

(63) Continuation of application No. 11/878,923, filed on Jul. 27, 2007, now Pat. No. 8,400,776.

(30) Foreign Application Priority Data

Jul. 28, 2006 (JP) ................................. 2006-205641

(51) Int. Cl.
*H05K 1/18* (2006.01)
*H05K 3/46* (2006.01)
(Continued)

(52) U.S. Cl.
CPC .............. *H05K 1/183* (2013.01); *H05K 3/4697* (2013.01); *H05K 1/0298* (2013.01);
(Continued)

(58) Field of Classification Search
USPC .......................... 361/760–766, 792–795, 803
See application file for complete search history.

(56) References Cited

U.S. PATENT DOCUMENTS 4,729,061 A * 3/1988 Brown .......................... 361/719
5,048,179 A 9/1991 Shindo et al.
(Continued)

FOREIGN PATENT DOCUMENTS

EP 1 478 023 11/2004
EP 1 534 054 5/2005
(Continued)

OTHER PUBLICATIONS

Office Action issued by the Japanese Patent Office on Jun. 28, 2011, for Japanese Patent Application No. 2006-205641, and English-language Summary thereof.
Office Action issued by the Taiwanese Patent Office on Nov. 5, 2012, for Taiwanese Patent Application No. 096126039, and English-language Summary thereof.

* cited by examiner

*Primary Examiner* — Tuan T Dinh
(74) *Attorney, Agent, or Firm* — Finnegan, Henderson, Farabow, Garrett & Dunner, L.L.P.

(57) ABSTRACT

A multilayered printed wiring board includes a plurality of insulating layers; a plurality of wiring layers which are located between the corresponding adjacent insulating layers; and a plurality of interlayer connection conductors for electrically connecting the wiring layers through the insulating layers; wherein a cavity is formed through one or more of the insulating layers so as to insert a first electric/electronic component and an area for embedding a second electric/electronic component is defined for the insulating layers.

1 Claim, 8 Drawing Sheets

(51) Int. Cl.
*H05K 1/02* (2006.01)
*H05K 1/03* (2006.01)
*H05K 3/28* (2006.01)
*H05K 3/40* (2006.01)

(52) U.S. Cl.
CPC ............. *H05K 1/0306* (2013.01); *H05K 3/284* (2013.01); *H05K 3/4069* (2013.01); *H05K 3/4614* (2013.01); *H05K 2201/10515* (2013.01); *H05K 2201/10636* (2013.01); *H05K 2203/049* (2013.01); *H05K 2203/061* (2013.01); *H05K 2203/063* (2013.01); *H01L 2224/16225* (2013.01); *H01L 2224/48091* (2013.01); *H01L 2224/73265* (2013.01); *H01L 2924/30107* (2013.01)
USPC ........... 361/761; 361/763; 361/764; 361/766; 361/795; 361/803

(56) References Cited

U.S. PATENT DOCUMENTS

| | | | |
|---|---|---|---|
| 5,111,278 A | 5/1992 | Eichelberger | |
| 5,306,670 A | 4/1994 | Mowatt et al. | |
| 5,422,513 A | 6/1995 | Marcinkiewicz et al. | |
| 6,555,906 B2 | 4/2003 | Towle et al. | |
| 6,586,276 B2 | 7/2003 | Towle et al. | |
| 6,705,003 B2 | 3/2004 | Motomura et al. | |
| 6,876,554 B1* | 4/2005 | Inagaki et al. | 361/763 |
| 7,161,371 B2 | 1/2007 | Higashitani et al. | |
| 7,317,621 B2 | 1/2008 | Kimura et al. | |
| 7,423,418 B2 | 9/2008 | Higashitani et al. | |
| 2003/0057563 A1* | 3/2003 | Nathan et al. | 257/777 |
| 2005/0122698 A1 | 6/2005 | Ho et al. | |
| 2005/0157478 A1* | 7/2005 | Inagaki et al. | 361/763 |
| 2006/0154496 A1 | 7/2006 | Imamura et al. | |
| 2008/0073024 A1 | 3/2008 | Kimura et al. | |

FOREIGN PATENT DOCUMENTS

| | | |
|---|---|---|
| JP | 9-8175 | 1/1997 |
| JP | 2003-243797 | 8/2003 |
| JP | 2004-134424 | 4/2004 |
| JP | 2004-165681 | 6/2004 |
| JP | 2005-032739 | 2/2005 |
| JP | 2005-072414 | 3/2005 |
| JP | 2005-072415 | 3/2005 |
| JP | 2005-158770 | 6/2005 |
| KR | 10-2005-0083726 | 8/2005 |
| TW | 587412 | 5/2004 |
| TW | 200612792 | 4/2006 |
| WO | WO 2004/034759 A1 | 4/2004 |

MULTILAYERED PRINTED WIRING BOARD

CROSS-REFERENCE TO RELATED APPLICATIONS

This is a continuation of application Ser. No. 11/878,923, filed Jul. 27, 2007, which is incorporated herein by reference.

This application is based upon and claims the benefit of priority from the prior Japanese Patent Application No. 2006-205641 filed on Jul. 28, 2006; the entire contents which are incorporated herein by reference.

BACKGROUND

1. Field of the Invention

The present invention relates to a multilayered printed wiring board, e.g., which is employed as a module board in a portable device and a method for manufacturing the multilayered printed wiring board.

2. Description of the Related Art

Recently, the downsizing and the weight saving for a portable device such as a cellular phone are developed and moreover, the performance of the portable device is developed. In this case, a multilayered printed wiring board is employed as the module board in the portable device. In view of the above-described requirements for portable device, it is desired to downsize, thin and grow in density the multilayered printed wiring board while an area to mount some electric/electronic components is maintained.

In this point of view, a built-in component type wiring board is proposed in Reference 1 wherein one or more micro chips such as 0402 chip and 0603 chip are built in so as to enhance the reliability of the micro chip(s). According to the built-in component type wiring board, the packaging density of component for the module board can be enhanced so that the module board can be downsized.

Moreover, one or more depressed portions are formed at a multilayered printed wiring board so that some electric/electronic components are housed in the corresponding depressed portions (see, Reference 2). In this case, the total thickness of the multilayered printed wiring board can be reduced. Referring to Reference 2, the bottom printed wiring board and the top printed wiring board are prepared, and some components are mounted on the bottom printed wiring board and some openings are formed at the top printed wiring board so that the components can be inserted into the openings at the laminating using an adhesive resin sheet. In this case, the components are surrounded by a resin.

[Reference 1] JP-A 2004-134424 (KOKAI)
[Reference 2] JP-A 2005-32739 (KOKAI)

However, the electric/electronic component(s) may generate heat. Therefore, when the electric/electronic component(s) is (are) built in, the thus obtained built-in component type wiring board may exhibit some disadvantages due to the heat from the electric/electronic component(s). Moreover, in the built-in component type wiring board, the electric/electronic component(s) cannot be wire-bonded. Also, it is desired that the electric/electronic component(s) are inserted in the corresponding depressed portion(s) (cavity (cavities)) so as to reduce the total thickness of the board.

As of now, it is desired that various electric/electronic components are mounted on the module board so that the module board must satisfy various requirements. For example, the module mode is configured so as to embed the components therein, mount the component on the main surface or insert the components in the corresponding depressed portions (cavities) in view of the sizes and shapes of the components.

BRIEF SUMMARY OF THE INVENTION

In view of the above-described problems, it is an object to provide a multilayered printed wiring board which can contain an electric/electronic component irrespective of the size and shape of the component so as to be downsized and thinned and the method for manufacturing the multilayered printed wiring board.

In order to achieve the above object, an aspect of the present invention relates to a multilayered printed wiring board, including: a plurality of insulating layers; a plurality of wiring layers which are located between the corresponding adjacent insulating layers; and a plurality of interlayer connection conductors for electrically connecting the wiring layers through the insulating layers; wherein a cavity is formed through one or more of the insulating layers so as to insert a first electric/electronic component and an area for embedding a second electric/electronic component is defined for the insulating layers.

Herein, the "cavity" requires an opening at the top thereof because the first electric/electronic component is inserted into the cavity from the opening. Then, the "cavity" requires a bottom for mounting the first electric/electronic component. The first electric/electronic component is electrically connected with terminals provided on the bottom of the cavity or outside from the cavity.

Another aspect of the present invention relates to a method for manufacturing a multilayered printed wiring board, comprising the steps of: preparing a first printed wiring board and a second printed wiring board; forming, at the second printed wiring board, a first through-hole as a cavity for inserting a first electric/electronic component and a second through-hole for embedding a second electric/electronic component; mounting the second electric/electronic component on the first printed wiring board; forming conductive bumps to be converted into interlayer connection conductors on the second printed wiring board so as to be opposite to the first printed wiring board; and laminating the first printed wiring board and the second printed wiring board so that the first printed wiring board can be electrically connected with the second printed wiring board via the interlayer connection conductors.

In an embodiment, a conformal member for controlling an amount of a resin of a prepreg to be coated on an inner wall of the cavity is formed. In another embodiment, a holding plate for controlling an amount of a resin of a prepreg to be filled in a space around the second electric/electronic component is formed.

In still another embodiment, the thickness of the first printed wiring board is set equal to the thickness of the second printed wiring board.

According to the aspects of the present invention can be provided a multilayered printed wiring board having the area to embed an electric/electronic component and the cavity for inserting another electric/electronic component and the manufacturing method of the multilayered printed wiring board. Therefore, the multilayered printed wiring board can be configured so as to embed a component therein, mount another component on the main surface or insert still another component in the corresponding depressed portion (cavity) in view of the sizes and shapes of the components. As a result, if the multilayered printed wiring board is employed as the module board for a portable device, the portable device can be downsized and thinned.

BEST MODE FOR IMPLEMENTING THE INVENTION

Figure 1A:
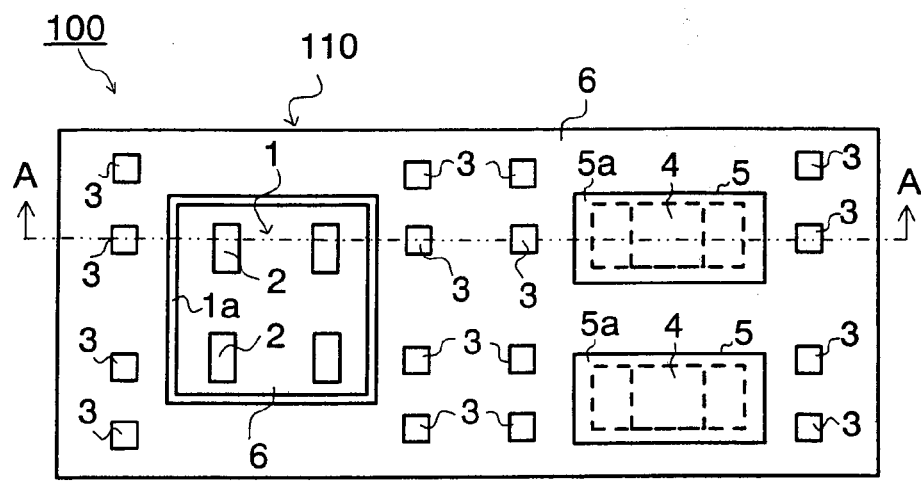
FIG. 1A is a top plan view showing the structure of a multilayered printed wiring board according to an embodiment of the present invention.

Hereinafter, the present invention will be described in detail with reference to the drawings. Like or corresponding components are designated by the same reference numerals throughout the drawings and the explanation for like or corresponding components will be omitted. The embodiments and the drawings will be described for the convenience of the understanding of the present invention so that the present invention is not limited to the embodiments and the drawings. Moreover, the drawings are schematically illustrated so that some components may be different from real ones.

Figure 1B:
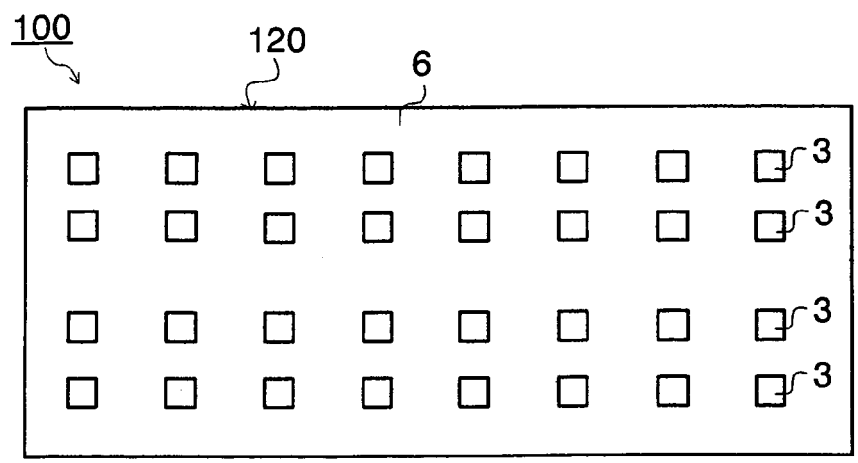
FIG. 1B is a bottom plan view showing the structure of a multilayered printed wiring board according to an embodiment of the present invention.
Figure 2:
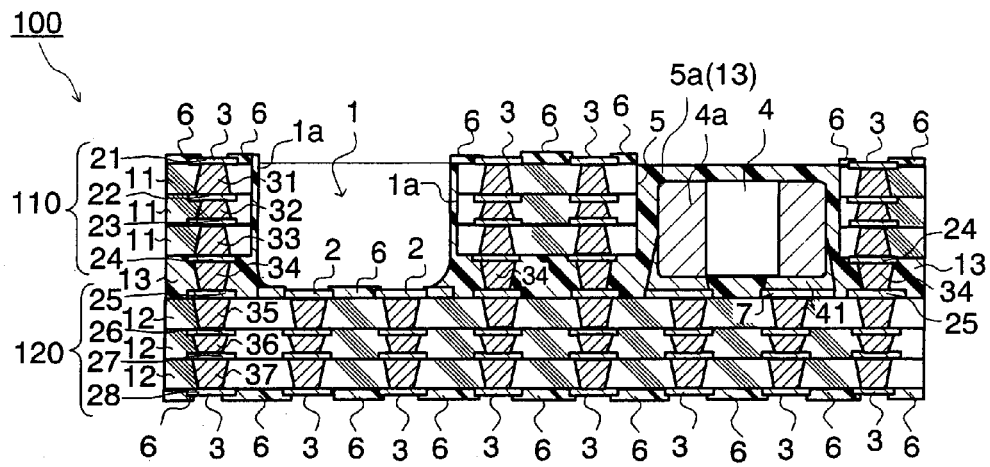
FIG. 2 is a cross sectional view showing the structure of the multilayered printed wiring board in FIG. 1, taken on line A-A.
Figure 3:
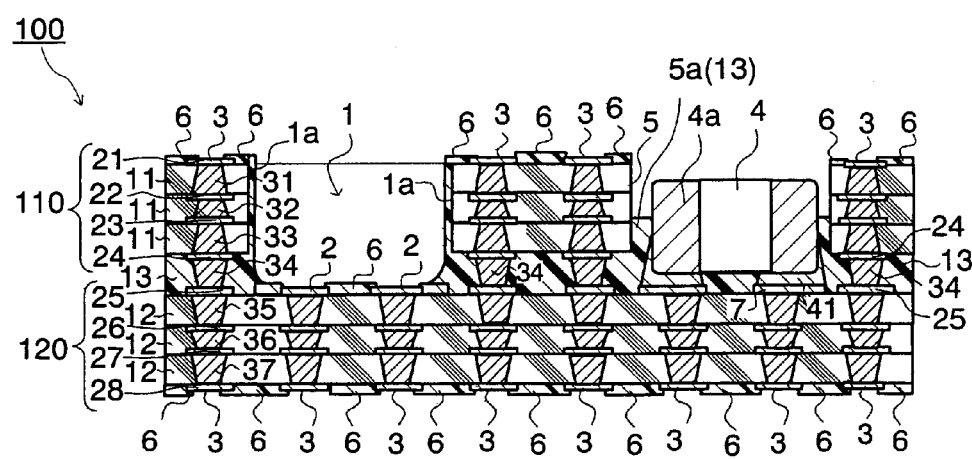
FIG. 3 is a cross sectional view showing the structure of a multilayered printed wiring board modified from the one shown in FIG. 2.

First of all, a multilayered printed wiring board according to this embodiment will be described with reference to FIGS. 1 to 3. FIG. 1A is a top plan view showing the structure of the multilayered printed wiring board according to this embodiment. FIG. 1B is a bottom plan view showing the structure of the multilayered printed wiring board according to this embodiment. FIG. 2 is a cross sectional view showing the structure of the multilayered printed wiring board in FIG. 1, taken on line A-A. FIG. 3 is a cross sectional view showing the structure of a multilayered printed wiring board modified from the one shown in FIGS. 1 and 2.

As shown in FIGS. 1 and 2, the printed wiring board 100 includes a cavity 1 to insert therein an electric/electronic component from the opening thereof, areas 5 to embed other electric/electronic components 5, wiring layers 21 to 28 with the respective wiring patterns (eight wiring layers), insulating layers 11 to 13 and interlayer connection conductors 31 to 37, thereby constituting an eight-layered printed wiring board. In this embodiment, two areas 5 are provided so that two electric/electronic components 4 are embedded in the corresponding areas 5, respectively. The top of each component 5 is covered with resin.

The cavity 1 is designed in view of the size and depth thereof so that the electric/electronic component can be inserted into the cavity 1. The top side of the cavity 1 is opened. Terminals 2 for mounting are provided on the bottom of the cavity 1 so as to electrically connect the electric/electronic component to be inserted. Then, the outermost wiring patterns are exposed from the main surfaces of the multilayered printed wiring board 100 so as to form terminals 3 for packaging on the main surfaces thereof. The spaces between the adjacent terminals 3 are embedded by protective layers 6 made of, e.g., solder resist. In other words, the multilayered printed wiring board 100 is covered with the protective layers 6 on the main surfaces thereof. The areas 5 are not covered with the protective layer 6 dependent on the manufacturing method of the multilayered printed wiring board 100 as described below.

The insulating layers 11 to 13 may be made from the respective prepregs. Each prepreg may be made of a base of glass fiber nonwoven material, organic fiber nonwoven material or paper and an unhardened epoxy resin, polyimide resin, bismaleimide resin or phenol resin which is infiltrated into the base. Concretely, glass cloth-epoxy based prepreg may be exemplified. It is desired that the insulating layers 11 and 12 are made of the same material. In this embodiment, three insulating layers 11 are formed and three insulating layers 12 are formed due to the number of wiring layer. However, the numbers of the insulating layers 11 and 12 may be set to any number as occasion demands, respectively. The total thickness of three insulating layers 11 can be set in accordance with the thickness of the electric/electronic component 4 to be embedded and the depth of the cavity 1. Each patterned wiring layer may be made of an electrolytic copper foil with a thickness of 18 □m by means of photolithography.

In this embodiment, the first wiring layer 21 is electrically connected with the second wiring layer 22 via the interlayer connection conductors 31 through the interlayer insulating layer 11. The second wiring layer 22 is electrically connected with the third wiring layer 23 via the interlayer connection conductors 32 through the interlayer insulating layer 11. The third wiring layer 23 is electrically connected with the fourth wiring layer 24 via the interlayer connection conductors 33 through the interlayer insulating layer 11. The fourth wiring layer 24 is electrically connected with the fifth wiring layer 25 via the interlayer connection conductors 34 through the interlayer insulating layer 13. The fifth wiring layer 25 is electrically connected with the sixth wiring layer 26 via the interlayer connection conductors 35 through the interlayer insulating layer 12. The sixth wiring layer 26 is electrically connected with the seventh wiring layer 27 via the interlayer connection conductors 36 through the interlayer insulating layer 12. The seventh wiring layer 27 is electrically connected with the eighth wiring layer 28 via the interlayer connection conductors 37 through the interlayer insulating layer 12.

The terminals 2 and 3 may be configured in accordance with the structures of the wiring layers 21 to 28. The areas 5 and the cavity 1 may be also configured in accordance with the sizes and shapes of the electric/electronic components to be embedded and to be inserted. In this embodiment, although the eight-layered printed wiring board is formed, any number-layered printed wiring board may be formed. In view of the embedding of the component and the insertion of the component, it is desired to form a three or more-layered printed wiring board.

When the electric/electronic component is mounted in the cavity, the electric/electronic component is electrically connected with one or more of the wiring layers via an terminal. In this embodiment, the terminal 2 is preferably provided at the bottom of the cavity 1, but may be provided at any portion of the cavity 1 only if the electric/electronic component is electrically connected with one or more of the wiring layers via the terminal 2. For example, the terminal 2 is provided at the edge of the opening of the cavity 1.

The electric/electronic component 4 to be embedded may be exemplified a passive component such as a chip resistor, a chip conductor, a chip inductance and an active component such as a bare chip to be flip chip-bonded. The size of the electric/electronic component 4 may be set to 0.4 mm×0.2 mm (0402) or 0.6 mm×0.3 mm (0603). Since the thickness of the exemplified component is almost equal to the narrow side of the component, the exemplified component can be embedded into the board with a thickness of about 0.5 mm. Since the component 4 is very small and thus, can not be mounted firmly, the component 4 is unlikely to be dropped out when the component 4 is embedded.

As shown in FIG. 2, the electric/electronic component 4 is embedded so as to be mounted on the lands 7 composing the wiring layer 25 which is located almost at the center of the multilayered printed wiring board 100 in the thickness direction thereof. In this point of view, it is considered that the electric/electronic component 4 is mounted on the wiring layer 25.

Moreover, since the multilayered printed wiring board 100 includes the top printed wiring board 110 and the bottom printed wiring board 120 containing the wiring layer 25 as a top wiring layer via the insulating layer 13, as shown in FIGS. 1 and 2, it is considered that the electric/electronic component 4 is mounted on the bottom printed wiring board 120. The top printed wiring board 110 includes the areas 5 to embed the respective electric/electronic components 4 and the cavity 1. The top printed wiring board 110 and the bottom printed wiring board 120 can be formed independently, and then, laminated one another after the electrical connection check so that the intended electric/electronic component is inserted in the cavity 1 and the electric/electronic components 4 are embedded into the corresponding areas 5.

The terminals 4a of the electric/electronic component 4 are electrically and mechanically connected with the lands 7 of the wiring layer 25 at the connections (soldered portions) 41. The connections 41 is made of solder cream, e.g., with a melting point of 200 to 240° C. higher than a melting point of a normal solder to be used in the packaging and connection for another electronic component. In this case, the connections 41 can not be re-melted in the packaging and connection for another electronic component.

As shown in FIGS. 1 and 2, the electric/electronic components 4 are surrounded by the resin of the prepreg to be converted into the insulating layer 13. In this case, the connections 41 are preferably covered with the resin of the prepreg in order to prevent the drop off of the electric/electronic components 4.

Only if the drop off of the electric/electronic components 4 can be prevented, the electric/electronic components 4 are not always required to be surrounded by the resin of the prepreg entirely.

The interlayer connection conductors 31 to 37 are originated from the conductive bumps formed by means of screen printing of conductive composition paste (often called as "conductive paste"). Therefore, the diameter of each interlayer connection conductor is changed along the axial direction thereof (the thickness direction of the board 100). The conductive paste may be made, e.g., by dispersing conductive metallic powders of Ag, Au or Cu into the resin paste. In the use of the conductive paste, the aspect ratio of the conductive bump can be increased by means of screen printing using a metallic mask with a larger thickness. The diameter and height of the conductive bump may be determined in view of the wiring distance and the thickness of the prepreg.

If the wiring layers are electrically connected with one another via the interlayer connection conductors made of the conductive bumps, the wiring layers can be patterned minutely and the manufacturing process can be simplified in comparison with the plated films for electrical connection formed on the inner walls of the though-holes through the insulating layers.

The interlayer connection conductors 34 are disposed between the wiring layers 24 and 25 so that the diameters of the interlayer connection conductors 34 are increased from the bottoms in the side of the wiring layer 25 to the tops in the side of the wiring layer 24 because the conductive bumps to be the interlayer connection conductors 34 are formed on the lands 8 of the wiring layer 24. If the conductive bumps are not formed on the wiring layer 24, the conductive bumps are necessarily formed on the wiring layer 25. In this case, the conductive bumps are formed on the same surface as the mounting surface of the electric/electronic components 4 so that the complicated screen printing technique and the like are required because the solder cream for mounting the electric/electronic components 4 and the conductive paste for forming the conductive bumps are simultaneously formed on the same surface. In this point of view, the manufacturing process becomes complicated.

As shown in FIG. 2, the interlayer connection conductors 31 to 33 of the top printed wiring board 110 and the interlayer connection conductors 35 to 37 of the bottom printed wiring board 120 are formed along the axial direction thereof. Concretely, the diameters of the interlayer connection conductors 31 to 33 are decreased from the bottoms thereof to the tops thereof in the stacking direction. The diameters of the interlayer connection conductors 35 to 37 are increased from the bottoms thereof to the tops thereof in the stacking direction. However, the interlayer connection conductors 31 to 33 and 35 to 37 may be configured as occasion demands. Preferably, the diameters of the interlayer connection conductors are set smaller on the minute wiring pattern, respectively. The interlayer connection conductors may be formed by means of through-hole instead of the conductive bumps. The top printed wiring board 110 and the bottom printed wiring board 120 may be laminated by using the interlayer connection conductors as shown in FIG. 2. In this case, the laminating process can be simplified and the high density packaging of the electric/electronic components can be realized. The thus obtained laminated structure is a stacked via structure.

In this embodiment, since the electric/electronic component 4 such as the 0402 chip is embedded into the multilayered printed wiring board 100, the multilayered printed wiring board 100 can be downsized without the decrease of the number of component. Then, since the multilayered printed wiring board 100 can include some electric/electronic components on the both main surfaces thereof, the number of the components can be increased while the multilayered printed wiring board 100 is maintained smaller. In the latter case, the electric/electronic components are disposed except the cavity 1 and/or over the cavity 1.

In this way, the electric/electronic components can be mounted on the main surfaces and in the cavity formed in the multilayered printed wiring board, and embedded in the multilayered printed wiring board. Even though the number of the components is increased, therefore, the multilayered printed wiring board can be downsized. Therefore, the multilayered printed wiring board 100 may be employed as a module board to be used for a sensor module or a camera module. Since the module board is built in a portable device, the module board is required to be downsized, thinned, grown in density. The multilayered printed wiring board 100 can satisfy these requirements.

In this embodiment, the inner wall la of the cavity 1 is coated with a resin. In this case, the reinforcement fibers located in the vicinity of the cavity 1 can be fixed so as to prevent the powder dust from the reinforcement fibers. The cavity 1 may be formed by means of normal processing means such as drilling, router processing or laser processing. In this case, since the inner wall 1a is coated with the resin, the powder dust can be prevented so that the electric/electronic component inserted in the cavity 1 can not suffer from the powder dust. Therefore, the malfunction of the component can be prevented. As the component subject to the powder dust can be exemplified a sensor. The coating with the resin is not essential in this embodiment (present invention).

The concrete size of the multilayered printed wiring board 100 depends on the use thereof. It the multilayered printed wiring board 100 is employed as the module board, the board 100 is designed commensurate with the module board.

Figure 6:
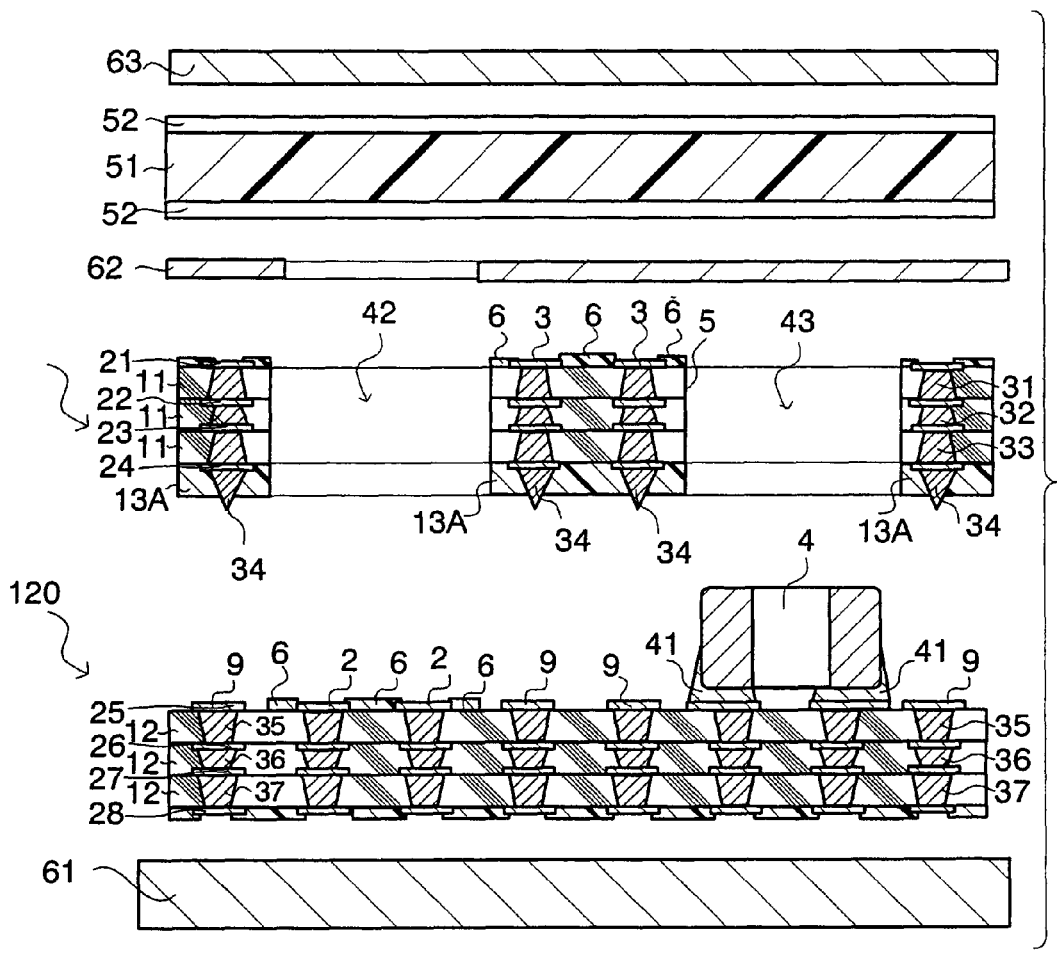
FIG. 6 relates to cross sectional views schematically showing a step in a manufacturing method for a multilayered printed wiring board according to the present embodiment.
Figure 7:
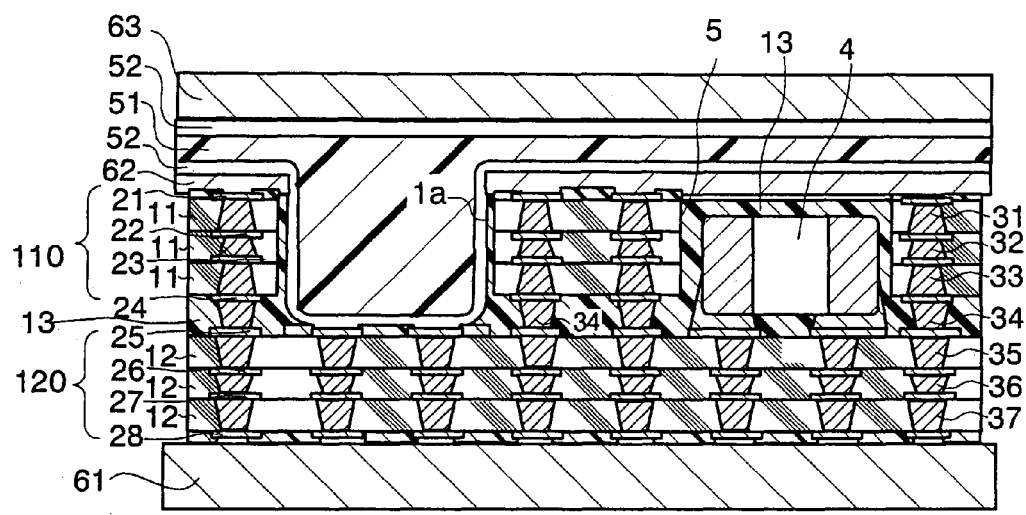
FIG. 7 relates to cross sectional views schematically showing another step in a manufacturing method for a multilayered printed wiring board according to the present embodiment.

Then, the manufacturing method of the multilayered printed wiring board 100 will be described with reference to FIGS. 4 to 7. FIG. 4 relates to cross sectional views schematically showing some steps in the formation of the bottom printed wiring board 120. FIG. 5 relates to cross sectional views schematically showing some steps in the formation of the top printed wiring board 110. FIG. 6 shows the state where the top printed wiring board 110 and the bottom printed wiring board 120 are laminated. FIG. 7 shows the state where the top printed wiring board 110 and the bottom printed wiring board 120 are pressed against one another.

As shown in FIGS. 4 to 7, the top printed wiring board 110 and the bottom printed wiring board 120 are formed independently. Then, the top printed wiring board 110 and the bottom printed wiring board 120 are laminated and pressed one another, thereby forming the multilayered printed wiring board 100. As described below, a roll off is formed at the top printed wiring board 110 so as to embed the electric/electronic component 4. Then, the electric/electronic component 4 is mounted on the bottom printed wiring board 120 in advance.

The top printed wiring board 110 and the bottom printed wiring board 120 are preferably made of the same material as one another and formed in the same size as one another. If the top printed wiring board 110 and the bottom printed wiring board 120 are made of the same material and formed in the same thickness, the warpage of the multilayered printed wiring board 100 can be prevented through the laminating between the top printed wiring board 110 and the bottom printed wiring board 120. If the top printed wiring board 110 and the bottom printed wiring board 120 are formed in the same width and length, the outer surfaces (main surfaces) of the multilayered printed wiring board 100 for mounting the electric/electronic components can be substantially flattened.

Figure 4A:
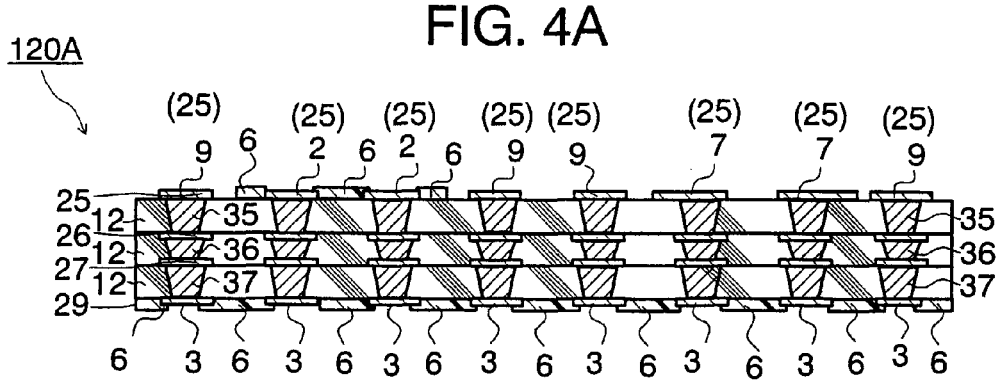
FIGS. 4A to 4C relate to cross sectional views schematically showing some steps in a manufacturing method for a multilayered printed wiring board according to the present embodiment.

Then, the manufacturing process will be described in detail. First of all, as shown in FIG. 4A, the bottom printed wiring board structure 120A is formed. The structure 120A may be formed by means of normal process. In this embodiment, the structure 120A is configured as a four-layered structure commensurate with the board 120 shown in FIG. 2. It is required that the structure 120A satisfies the requirements for the board 120.

As shown in FIG. 4A, the bottom printed wiring board structure 120A is covered with the protective layers 6 on both main surfaces thereof except the conductive patterns to be terminals 3 and the area for the cavity 1 to be formed. In this case, the wiring layers are patterned and the protective layers are formed before the laminating for the top printed wiring board 110 so that the manufacturing process can be simplified because it is difficult to pattern the wiring layers and form the protective layers after the laminating for the top printed wiring board 110.

The wiring layer 25 is formed with faced for the top printed wiring board 110. The wiring layer 25 includes the lands 2 for mounting the electric/electronic component to be inserted into the cavity 1, the lands 7 for mounting the electric/electronic components 4 to be embedded and the lands 9 for electrically connecting the top printed wiring board 110. The lands 9 are formed so as to be connected with the conductive bumps 34 (interlayer connection conductors 34) of the top printed wiring board 110.

Figure 4B:
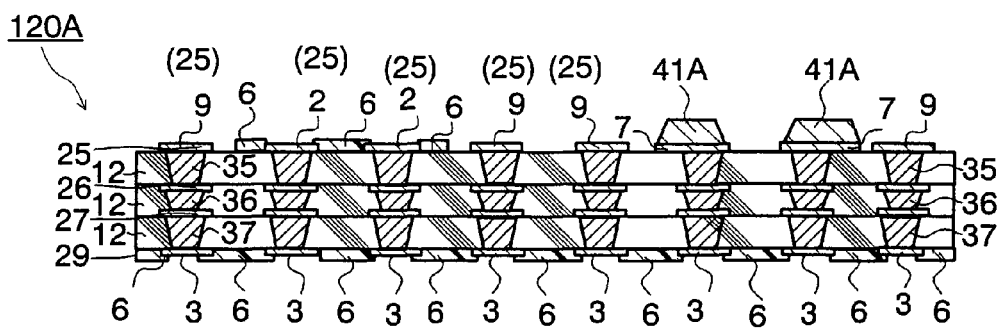

Then, as shown in FIG. 4B, the solder cream 41A is formed on the lands 7 by means of, e.g., screen printing. Instead of the screen printing, the dispenser may be used. Instead of the solder cream 41A, a conductive resin may be used.

Figure 4C:
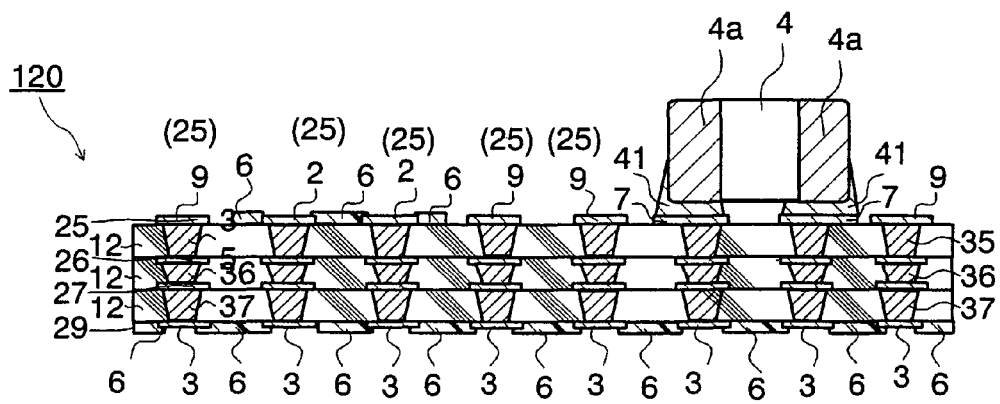

Then, the electric/electronic component 4 is mounted on the lands 7 via the solder cream 51A by means of mounter. The solder cream 51A is reflowed in a reflow furnace. As a result, as shown in FIG. 4C, the electric/electronic component 4 can be mounted on the lands 7 of the wiring layer 25 via the connections 41, thereby completing the bottom printed wiring board 120.

Figure 5A:
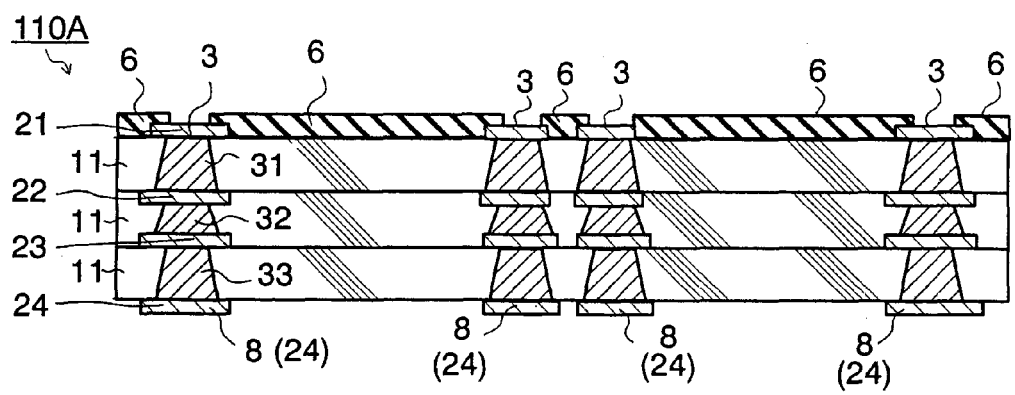
FIGS. 5A to 5D relate to cross sectional views schematically showing some steps in a manufacturing method for a multilayered printed wiring board according to the present embodiment.

Then, as shown in FIG. 5A, the top printed wiring board structure 110A is formed. The structure 110A may be formed by means of normal process. In this embodiment, the structure 110A is configured as a four-layered structure commensurate with the board 110 shown in FIG. 2. It is required that the structure 110A satisfies the requirements for the board 110.

As shown in FIG. 5A, the bottom printed wiring board structure 110A is covered with the protective layers 6 on the top main surface thereof except the conductive patterns to be terminals 3. Then, the lands 8 are formed on the bottom main surface so as to be electrically connected with the bottom printed wiring board 120. No protective layer 6 is formed on the bottom main surface. The wiring layers are formed except the areas for the through-holes to be formed. The through-holes function as embedding the electric/electronic component 4 and inserting another electric/electronic component.

Figure 5B:
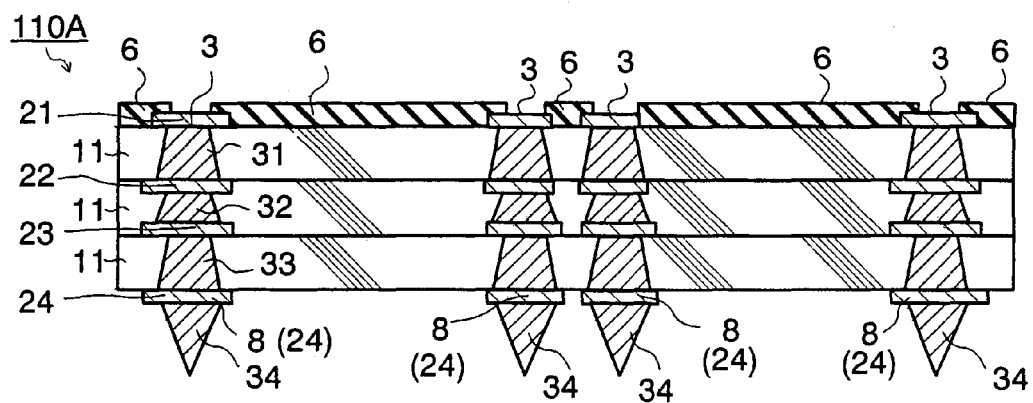

Then, as shown in FIG. 5B, the conical conductive bumps 34 are formed on the corresponding lands 8 of the wiring layer 8 by means of screen printing, subsequently dried and hardened to form the interlayer connection conductors 34 for electrically and mechanically connecting the lands 9 of the bottom printed wiring board 120. The size and height of each conductive bump is determined in view of the prepreg to be formed on the insulating layer 11 because the forefront of each conductive bump is required to be exposed from the prepreg.

Figure 5C:
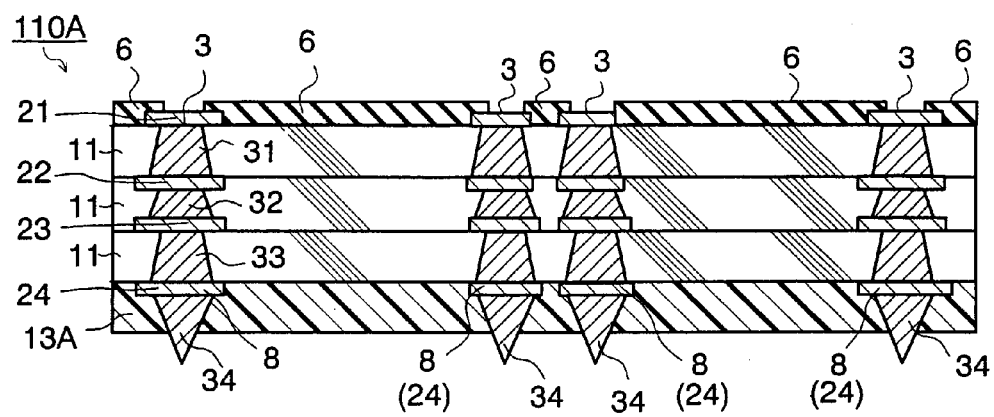

Then, as shown in FIG. 5C, the prepreg 13A under semi-hardened condition (B-stage) is formed on the insulating layer 11 so that the forefront of each conductive bump is exposed from the prepreg 13A. Concretely, the prepreg 13A is contacted with the top printed wiring board structure 110A shown in FIG. 5B and the thus obtained laminated structure is disposed between the heated plates via aluminum foils or rubber sheets so as to be heated to 100° C. and pressed under the pressure of 1 MPa. In this case, the conductive bumps are converted into the interlayer connection conductors 34. The forefronts of the interlayer connection conductors 34 may be flattened during or after the formation thereof. The interlayer connection conductors 34 are configured such that the diameter of each interlayer connection conductor 34 is changed along the axial direction.

Figure 5D:
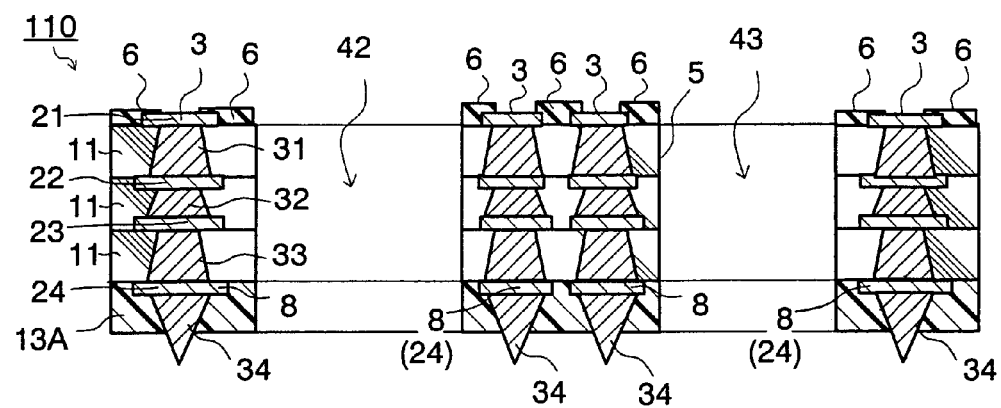

Then, as shown in FIG. 5D, the through-holes 42 and 43 are formed at the top printed wiring board structure 110A by means of normal processing means such as drilling, router processing, punching processing or laser processing. In the processing of the through-holes 42 and 43, it is desired not to create powder dust. It is desired, therefore, to remove the powder dust by means of dust roller, air blow machine or dust collector after the through-holes 42 and 43 are formed. If a protective layer is formed on the prepreg 13A so as to cover the forefronts of the interlayer connection conductors 34, the powder dust is unlikely to be directly attached to the forefronts of the interlayer connection conductors 34 and the prepreg 13A.

The through-holes 42 and 43 may be formed at the top printed wiring board structure 110A before the conductive bumps are formed at the step shown in FIG. 5A. In this case, the conductive bumps and the prepreg 13A are subsequently formed after the through-holes 42 and 43 are formed. In this way, the top printed wiring board 110 can be formed as shown in FIG. 5D.

When the through-holes 42 and 43 are formed in advance, the top printed wiring board structure 110A may be warped by the screen printing. In this point of view, it is desired that the through-holes 42 and 43 are embedded with the jigs (not shown). Herein, it is required that the jigs are not projected from the top printed wiring board structure 110A so as to maintain flat the main surfaces of the structure 110A.

The prepreg 13A may be made of a base of glass fiber nonwoven material, organic fiber nonwoven material of aramid fiber or paper and an unhardened epoxy resin, polyimide resin, bismaleimide resin or phenol resin which is infiltrated into the base. Concretely, glass cloth-epoxy based prepreg may be exemplified because the resin of the prepreg is not almost flowed within a processing temperature range. However, a flow-type prepreg may employed which is flowed within a processing temperature range. In the use of the flow-type prepreg, the electric/electronic component 4 to be embedded can be surrounded by the resin of the prepreg at the processing.

Then, as shown in FIG. 6, the bottom printed wiring board 120 as shown in FIG. 4C is disposed on the large holding plate 61 so that the mounting surface of the electric/electronic component 4 is faced upward. Then, the top printed wiring board 110 is laminated onto the bottom printed wiring board 120 so that the electric/electronic component 4 can be inserted into the through-hole 43 and the interlayer connection conductors 34 (conductive bumps 34) can be connected with the lands 9 of the wiring layer 25. Then, the first holding plate 62 is disposed on the top printed wiring board 110. The opening is formed at the plate 62 so as to correspond to the through-hole 42, but no opening is formed at the plate 62 so as to correspond to the through-hole 43. Then, the conformal member 51 with the exfoliate films 52 is disposed on the plate 62. Then, the holding plate 63 is disposed on the member 51. No opening is formed at the plate 63.

The conformal member 51 controls the amount of the resin of the prepreg 13A to be flowed around the electric/electronic component 4 in the through-hole 43 and the amount of the resin of the prepreg 13A to be flowed into the through-hole 42 to be the cavity 1. In the through-hole 42, the resin of the prepreg 13A is flowed along the inner wall of the through-hole 42. The conformal member 51 may be made of a resin with a melting point lower than the glass transition temperature of the prepreg 13A such as a polyethylene film with low melting point of about 90° C.

The holding plates 61, 62, and 63 may be made of a metallic plate such as a stainless steel plate or a brass plate or a thermal resistance resin plate such as a polyimide resin plate (sheet) or polytetrafluoroethylene resin plate (sheet).

As shown in FIG. 6, it is desired that the size of the opening of the holding plate 62 is set slightly smaller than the size of the through-hole 42 of the top printed wiring board 110. For example, the difference in radius between the opening of the holding plate 62 and the through-hole 42 of the top printed wiring board 110 is preferably set slightly larger than the thickness of the resin to be formed on the inner wall 1a of the through-hole 42. In this case, since the edges of the opening of the holding plate 62 are located at the inner sides from the edges of the through-holes 42 by the difference slightly larger than the thickness of the coating to be formed, the resin coating can be performed appropriately on the inner wall 1a and the top ends of the resin coated can be set equal to the top surface level of the top printed wiring board 110.

Then, the thus obtained laminated structure in FIG. 6 is disposed between the heating plates, heated and pressed for several ten minutes. The heating temperature is set within a temperature range not less than the melting point of the conformal member 51 and less than the temperature for the resin not to be flowed, e.g., within 95±5° C. The pressure is set to 2 MPa. In this case, the conformal member 51 is melted and dropped down with the exfoliate films 52. Then, as shown in FIG. 7, the through-hole 42 is embedded by the conformal member 51 with the exfoliate films 52 because the conformal member 51 can be deformed freely.

In this case, since the conformal member 51 is filled into the through-hole 42 via the opening of the holding plate 62, a minute space can be formed between the inner wall of the through-hole 42 and the conformal member 51 filled in by the difference in radius between the opening of the holding plate 62 and the through-hole 42 of the top printed wiring board 110. In this case, the resin of the prepreg 13A is flowed into the through-hole 42 through the minute space. Moreover, a similar minute space is formed between the holding plate 62 and the top surface of the electric/electronic component 4. Therefore, the resin of the prepreg 13A is flowed into space around the electric/electronic component 4 through the minute space.

As shown in FIG. 7, the forefronts of the conductive bumps 34 are pressed against the lands 8 of the bottom printed wiring board 120, and plastically deformed in conical shape during the pressing process under the heating condition. In this case, the conductive bumps 34 are converted into the interlayer connection conductors 34 so as to electrically connect the top printed wiring board 110 and the bottom printed wiring board 120.

In this case, the resin of the prepreg 13A is flowed to fill in the space between the insulating layer 11 of the top printed wiring board 110 and the insulating layer 12 of the bottom printed wiring board 120 and in the space around the electric/ electronic component 4. At the same time, the resin of the prepreg 13A is flowed into the through-hole 42 through the minute space formed as described above so that the inner wall 1a of the through-hole 42 is coated with the resin. If the difference in radius between the opening of the holding plate 62 and the through-hole 42 of the top printed wiring board 110 is not formed, the inner wall 1a is not coated with the resin of the prepreg 13A. However, the space around the electric/electronic component 4 can be filled with the resin of the prepreg 13A.

After the prepreg 13A is hardened to be converted into the insulating layer 13, the holding plates 61 to 63, the conformal member 51 with the exfoliate films 52 are released, thereby completing the multilayered printed wiring board 100 as shown in FIGS. 1 and 2. In this case, the through-hole 42 constitutes the cavity 1.

The multilayered printed wiring board 100 as shown in FIG. 3 can be formed in the same manner as described above.

The formation of the cavity to insert the electric/electronic component, the embedding of the electric/electronic component 4 and the coating of the resin on the inner wall of the cavity are restricted to the above-described embodiment. For example, the area 5 may be formed by means of counterboring process after the multilayered printed wiring board is formed. In this case, the electric/electronic component 4 is embedded by an additional sealing resin. Then, the inner wall of the cavity 1 may be coated by an additional coating resin.

When the counterboring process is employed for forming the area 5 to embed the electric/electronic component 4, the total manufacturing process becomes complicated because some wiring layers may be damaged through the counterboring process and it is difficult to form the minute area 5 through the counterboring process. When the inner wall 1a of the cavity 1 is coated by the additional coating resin, it is difficult to form the resin uniformly on the vertical inner wall 1a. Then, the additional coating step is added so that the total manufacturing process becomes complicated.

According to this embodiment, these disadvantages can be avoided. In addition, the cavity 1 to insert the electric/electronic component and the area 5 (space) to embed the electric/electronic component 4 can be formed simultaneously through the laminating between the top printed wiring board 110 and the bottom printed wiring board 120. In this point of view, the intended multilayered printed wiring board 100 can be easily formed according to the above-described embodiment.

The interlayer connection conductors 31 to 37 may be made of the respective conductive bumps. Each conductive bump may be made of a conductive composition paste (conductive paste). The conductive paste is made of a conductive metallic powder of Ag, Au or Cu, a conductive metallic alloy powder thereof or a conductive metallic composite powder thereof and a binder of polycarbonate resin, polysulfone resin, polyester resin, phenoxy resin or polyimide resin. Each conductive bump may be made of a conductive metal instead of the conductive paste. In the use of the conductive paste, the aspect ratio of the conductive bump can be developed by means of screen printing using a metallic mask with a larger thickness.

The conductive bumps may be formed as follows: (a) Minute metallic clots are dispersed and selectively adhered onto a conductive metallic layer via an adhesive. The size and shape of each metallic clot is defined as desired. The dispersion of the metallic clots may be performed via a mask. (b) A patterned resist is formed on an electrolytic copper foil and minute metallic bumps are formed of Cu, Sn, Au, Ag, solder by means of plating. (c) A patterned resist is formed on a conductive metallic layer and immersed in a solder bath to form minute metallic bumps. (d) A metallic plate is etched via a resist mask to form minute metallic bumps from the metallic plate. The minute metallic clots and the metallic bumps may be configured as a multilayered structure or a multilayered shell structure which is made of different metals. For example, the metallic clot and the metallic bump may be made by coating an Au or Ag layer around a Cu core or coating a solder layer around a Cu core. In the former case, the metallic clot and the metallic bump can exhibit the oxidation resistance. In the latter case, the metallic clot and the metallic bump can exhibit the soldering connection. In the use of the conductive paste, the conductive bumps can be easily formed so that the total manufacturing cost can be reduced.

In this embodiment, the conductive bumps 34 are formed on the top printed wiring board 100 not containing the electric/electronic component 4 mounted thereon. Concretely, the conductive bumps 34 are formed on the wiring layer 25 while the electric/electronic component 4 is mounted on the wiring layer 25. However, the conductive bumps 34 may be formed on the same surface as the electric/electronic component 4, concretely on the wiring layer 25. In this case, the effect/function relating to the above-described embodiment can not be exhibited.

Another Embodiment

Figure 8:
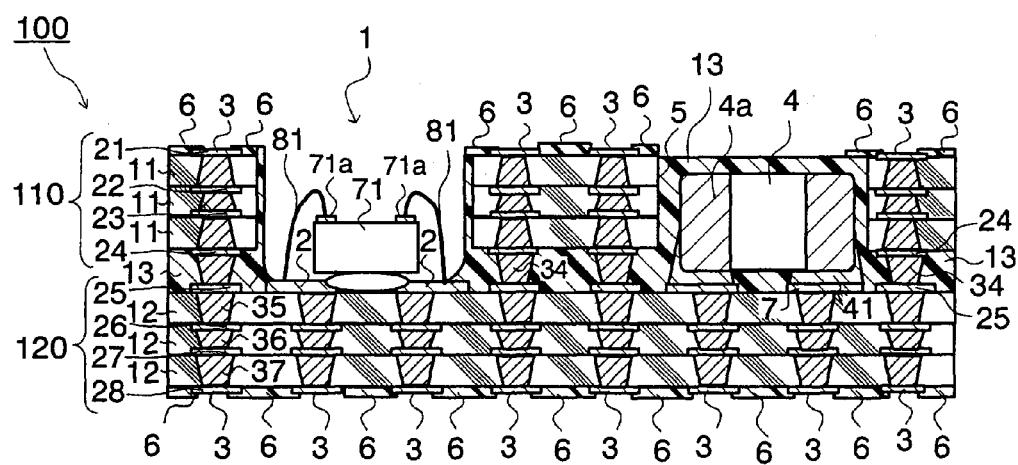
FIG. 8 shows the state where an electric/electronic component is mounted in the cavity of the multilayered printed wiring board according to the present embodiment.
Figure 9:
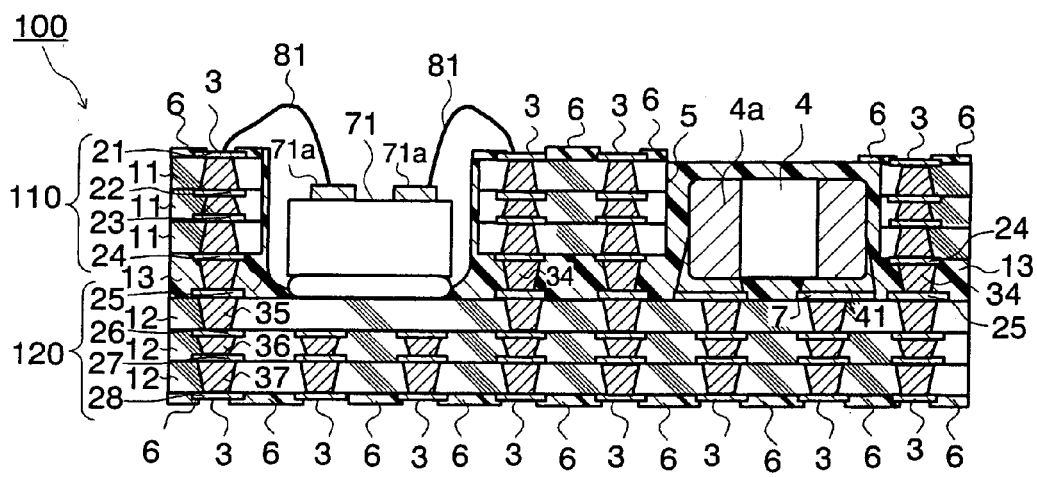
FIG. 9 also shows the state where an electric/electronic component is mounted in the cavity of the multilayered printed wiring board according to the present embodiment.
Figure 10:
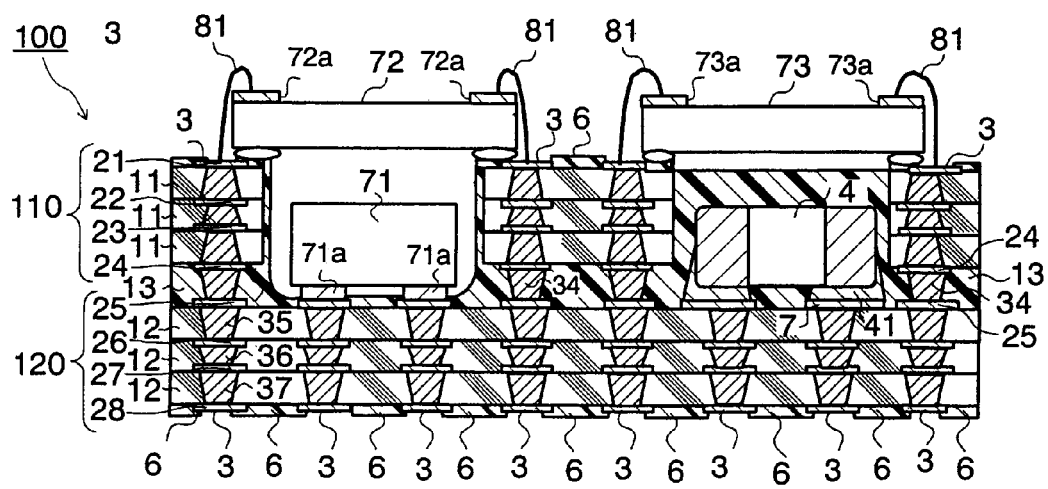
FIG. 10 also shows the state where an electric/electronic component is mounted in the cavity of the multilayered printed wiring board according to the present embodiment.

FIGS. 8 to 10 show the concrete conditions of the multilayered printed wiring board 100, respectively.

In FIG. 8, the electric/electronic component 71 with the terminals 71a on the top main surface thereof is mounted in the cavity 1 via the opening. The terminals 71a are electrically connected with the terminals 2 provided on the bottom of the cavity 1 by the bonding wires 81. The electric/electronic component 71 is not sealed by a resin. In this embodiment, the electric/electronic component 71 is set smaller than the electric/electronic component 4, but may be set larger than the electric/electronic component 4 because the sizes of the electric/electronic components 4 and 71 are not essential.

In FIG. 9, the electric/electronic component 71 with the terminals 71a on the top main surface thereof is mounted in the cavity 1 via the opening. The terminals 71a are electrically connected with the terminals 3 provided on the top surface in the vicinity of the cavity 1 by the bonding wires 81. In this case, the electric/electronic component 71 is electrically connected with the external terminals 3 outside from the cavity 1.

In FIG. 10, the electric/electronic component 71 with the terminals 71a on the bottom main surface thereof is mounted in the cavity 1 via the opening, and flip chip-bonded with the terminals 2 provided on the bottom of the cavity 1. Then, the electric/electronic component 72 is provided over the cavity 1 so that the terminals 72a provided on the top main surface of the component 72 are electrically connected with the terminals 3 provided on the top surface of the top printed wiring board 110 by the bonding wires 81. Then, the electric/electronic component 73 is provided above the electric/electronic component 4 embedded into the multilayered printed wiring board 100 so that the terminals 73a provided on the top main surface of the component 73 are electrically connected with the terminals 3 provided on the top surface of the top printed wiring board 110 by the bonding wires 81. FIG. 10 relates to an embodiment where some electric/electronic components are mounted on the top main surface of the multilayered printed wiring board 100.

The structures of the multilayered printed wiring board 100 relating to FIGS. 8 to 10 are exemplified so that another structure may be employed. The size and shape of the cavity 1 can be configured as occasion demands within the scope of the invention. The size and shape of the area 5 can be also configured as occasion demands within the scope of the present invention. The number of the cavity 1 and the number of the area 5 may be configured within the scope of the present invention. Then, a plurality of electric/electronic components may be mounted in the cavity 1 and/or embedded into the area 5. In this case, the electric/electronic components may be the same component or different components, respectively.

The multilayered printed wiring board 100 is characterized by forming the cavity 1 to insert the electric/electronic component and the area 5 to embed the electric/electronic component 4. Therefore, minute electric/electronic component(s) can be preferably mounted in the cavity 1 and/or embedded into the area 5 because the minute electric/electronic component(s) may be dropped off when mounted on the main surface(s) of the multilayered printed wiring board 100 due to the small connection strength. Also, not minute electric/electronic component(s) can be mounted on the main surface(s) of the multilayered printed wiring board 100. Moreover, if the minute electric/electronic component(s) of heat generation is (are) mounted and/or embedded, the multilayered printed wiring board 100 may exhibit some disadvantages. In this point of view, it is desired that the electric/electronic component(s) of heat generation is (are) mounted on the main surface(s) of the multilayered printed wiring board 100. In this way, the multilayered printed wiring board 100 can be downsized and thinned irrespective of the kind and property of the electric/electronic components to be mounted.

In addition, since the electric/electronic component 4 is surrounded by the resin of the prepreg and the connections 41 are sealed by the same resin, an additional resin is not required for sealing.

Although the present invention was described in detail with reference to the above examples, this invention is not limited to the above disclosure and every kind of variation and modification may be made without departing from the scope of the present invention.

What is claimed is:

1. A multilayered printed wiring board, comprising:
    a plurality of insulating layers, at least one of said insulating being formed of a prepreg comprising resin;
    a plurality of wiring layers which are located between the corresponding adjacent insulating layers; and
    a plurality of interlayer connection conductors for electrically connecting said wiring layers through said insulating layers;
    wherein a cavity is formed through two or more of said insulating layers so as to insert an electric/electronic component; and
    wherein an inner wall of said cavity is coated with resin flowed from said prepreg.

* * * * *